United States Patent
Hirose

(10) Patent No.: US 9,789,682 B2
(45) Date of Patent: Oct. 17, 2017

(54) METAL MASK AND SCREEN PRINTING APPARATUS

(71) Applicant: Nissan Motor Co., Ltd., Yokohama-shi, Kanagawa (JP)

(72) Inventor: Takuya Hirose, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 15/305,142

(22) PCT Filed: May 19, 2014

(86) PCT No.: PCT/JP2014/063262
§ 371 (c)(1),
(2) Date: Oct. 19, 2016

(87) PCT Pub. No.: WO2015/177850
PCT Pub. Date: Nov. 26, 2015

(65) Prior Publication Data
US 2017/0036434 A1 Feb. 9, 2017

(51) Int. Cl.
*H01M 8/0286* (2016.01)
*B41F 15/34* (2006.01)
(Continued)

(52) U.S. Cl.
CPC ............... *B41F 15/34* (2013.01); *B41C 1/14* (2013.01); *B41F 15/36* (2013.01); *B41F 15/44* (2013.01);
(Continued)

(58) Field of Classification Search
CPC ...... B41C 1/145; B41F 15/34; H01M 8/0286; H01M 8/0284; B41N 1/24
See application file for complete search history.

(56) References Cited

U.S. PATENT DOCUMENTS

| 5,373,786 A | 12/1994 | Umaba | |
|---|---|---|---|
| 2004/0191604 A1* | 9/2004 | Artibise | H01M 8/0276 429/483 |
| 2013/0032048 A1* | 2/2013 | Falcon | B41F 15/36 101/128.4 |

FOREIGN PATENT DOCUMENTS

| CN | 102421602 A | 4/2012 |
|---|---|---|
| CN | 102470665 A | 5/2012 |

(Continued)

*Primary Examiner* — Blake A Tankersley
*Assistant Examiner* — Michael Robinson
(74) *Attorney, Agent, or Firm* — Global IP Counselors, LLP

(57) ABSTRACT

A metal mask is used in applying a printing material to an object to be printed by the sliding of a squeegee across a first surface of the metal mask. The metal mask has a plurality of openings extending from the first surface to a second surface facing the object. The metal mask has a bridge section and a filling section. The bridge section is disposed between first and second openings, and is recessed from the second surface. The filling section is provided on the second surface-side of the bridge section for being filled with printing material. The filling section communicates with the respective ends of the first and second openings. When viewed from the second surface, the filling section has a width that is larger than a width of the openings in a direction that intersects with a direction extending between the first and second openings.

12 Claims, 7 Drawing Sheets

(51) Int. Cl.
*B41C 1/14*     (2006.01)
*B41F 15/36*    (2006.01)
*B41N 1/24*     (2006.01)
*H05K 3/12*     (2006.01)
*B41F 15/44*    (2006.01)
*H01M 8/0284*   (2016.01)
*H01M 8/1018*   (2016.01)

(52) U.S. Cl.
CPC ............ *B41N 1/24* (2013.01); *H01M 8/0284* (2013.01); *H01M 8/0286* (2013.01); *H05K 3/12* (2013.01); *H01M 2008/1095* (2013.01)

(56) References Cited

FOREIGN PATENT DOCUMENTS

| | | |
|---|---|---|
| JP | H05-338370 A | 12/1993 |
| JP | 2007-141486 A | 6/2007 |
| JP | 2007-331194 A | 12/2007 |
| JP | 2007-331195 A | 12/2007 |
| JP | 2009-226924 A | 10/2009 |
| WO | 2011/046432 A1 | 4/2011 |

\* cited by examiner

METAL MASK AND SCREEN PRINTING APPARATUS

CROSS-REFERENCE TO RELATED APPLICATIONS

This application is a U.S. National stage application of International Application No. PCT/JP2014/063262, filed May 19, 2014.

BACKGROUND

Field of the Invention

The present invention relates to a metal mask and a screen printing apparatus.

Background Information

In recent years, in response to social demands and trends rooted in energy and environmental issues, fuel cells, which operate at normal temperature and from which high power density can be obtained, are gaining attention as sources of power for electric vehicles as well as stationary power sources. Because the product of the electrode reaction is primarily water, fuel cells can provide clean power generation systems with low impact on the global environment. Polymer electrolyte fuel cells (PEFC) in particular, due to their ability to operate at relatively low temperatures, are considered promising power sources for electric vehicles.

A polymer electrolyte fuel cell comprises an electrolyte membrane, a catalyst layer formed on both sides of the electrolyte membrane, and a membrane electrode assembly (Membrane Electrode Assembly, hereinafter referred to as MEA) that has a gas diffusion layer (GDL), etc. A fuel cell is configured by layering a plurality of MEAs with interposed separators.

The screen printing method is used in the manufacture of fuel cells and is a known technique in which an adhesive is applied in a rectangular shape, forming a gasket on the surface of the separator.

In the screen printing method, a separator as the object to be printed is disposed separated on the lower surface of a metal mask provided with openings, a gasket as a printing material is placed on the upper surface of the metal mask, and a squeegee is pressed and slid over the separator. Accordingly, the gasket is passed through the openings provided in the metal mask, and the gasket is applied onto the surface of the separator by transfer molding.

In a subsequent step, the separator, on the surface of which the gasket is applied, is pressurized and laminated with another separator so that the gaskets face each other. At this time, if there is a gap between the laminated gaskets, there is the risk that fuel gas or oxidant gas will leak through the gap to the outside. It is therefore necessary to form a closed rectangular pattern on the gasket that is applied to the surface of the separator.

In relation to the foregoing, for example, in Japanese Laid Open Patent Application No. 2007-331195, described below, a surface on one side of a bridge that is disposed between a pair of openings is aligned with a surface on the side over which the squeegee is slid, and the surface of the other side of the bridge is recessed from the back surface on the side that is opposite the side on which the squeegee is slid. The bridge is provided so at to connect the pair of openings. According to this metal mask, the gasket is filled in the recess provided on the other side surface of the bridge along with the openings by the sliding of the squeegee; therefore, it is possible to apply the gasket having a continuous closed pattern on the surface of the separator.

SUMMARY

However, in the metal mask disclosed in Japanese Laid Open Patent Application No. 2007-331195, since the other side surface of the bridge is recessed from the back surface, the thickness of the printing material that is applied to the surface of the object to be printed becomes thin in the height direction, in the area that corresponds to the bridge. Furthermore, this area where the thickness is thin has the same width as the other areas in a direction that is perpendicular to the direction that connects the pair of openings. Therefore, there is the risk that problems will occur, due to the application amount being small. An example of a problem is, as described above, when the object to be printed is layered in a subsequent step, a gap forms at this area where the thickness is thinner, and gas leaks to the outside through the gap.

In order to solve the problem described above, the present invention provides a metal mask and a screen printing apparatus that are capable of preventing problems caused by the small application amount of printing material that is applied to the object to be printed.

The metal mask according to the present invention that achieves the object described above is used to apply printing materials to an object to be printed by the sliding of a squeegee. The metal mask is a metal mask for screen printing on which are formed a plurality of openings that pass through from a first surface on a side to which the squeegee is provided to a second surface on a side to which the object to be printed is provided. The metal mask comprises a bridge portion that is disposed between one of the openings and the other of the openings, and that is recessed from the second surface. The metal mask comprises a filling portion that is provided on the second surface side of the bridge portion, and in which is filled the printing material by the sliding of the squeegee. The filling portion communicates with the respective ends of the one opening and the other opening and, when viewed from the second surface, has a width in a second direction that intersects a first direction extending from the one opening to the other opening that is larger than the width of the openings in the second direction.

In addition, the screen printing apparatus according to the present invention that achieves the object above is a screen printing apparatus that has the metal mask described above.

According to the metal mask and the screen printing apparatus configured as described above, of the printing material that is applied to the surface of the object to be printed, in the area where the thickness in the height direction is thin corresponding to the area where the bridge portion is provided, a pattern is formed that is wider than in the other areas in the second direction. Therefore, it is possible to prevent problems caused by the small application amount of printing material that is applied to the object to be printed. Specifically, when such objects to be printed are laminated one on top of another, since the printing material is formed wide in the second direction in the area where the height direction thickness is thin, it is possible to more reliably seal the internal space of the printing material. Therefore, it is possible to provide a metal mask and a screen printing apparatus that are well able to prevent the generation of gaps between laminated printing materials and the leaking of gas to the outside.

BRIEF DESCRIPTION OF THE DRAWINGS

Referring now to the attached drawings which form a part of this original disclosure.

DETAILED DESCRIPTION OF THE EMBODIMENTS

Figure 1:
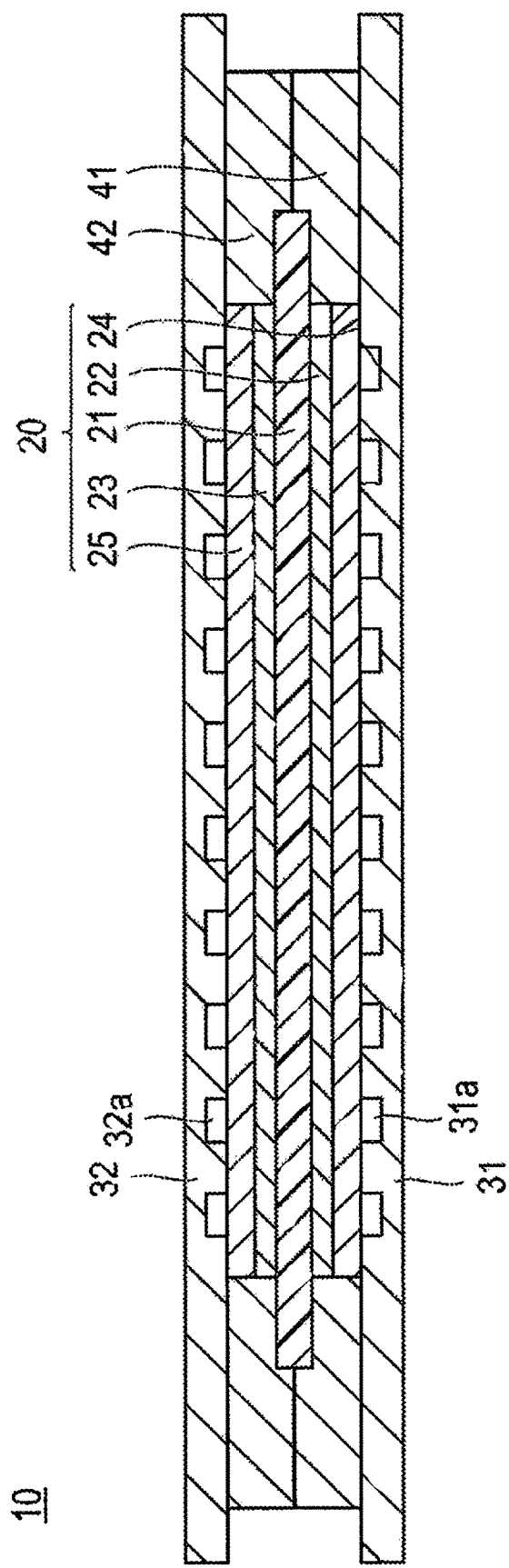
FIG. 1 is a cross-sectional view of a fuel cell illustrating the cell structure of the fuel cell.

Embodiments of the present invention will be explained below, with reference to the appended drawings. In the explanations of the drawings, the same elements are given the same reference signs, and redundant explanations are omitted. The dimensional ratios in the drawings are exaggerated for the sake of convenience of the explanation, and are different than the actual ratios.

FIG. 1 is a cross-sectional view illustrating the cell structure of a fuel cell.

A single cell 10 is applied to a polymer electrolyte fuel cell (PEFC), and the like, which uses hydrogen as fuel, and comprises an MEA 20, a pair of separators 31, 32 and a pair of gaskets 41, 42, as illustrated in FIG. 1.

The MEA 20 comprises a polymer electrolyte membrane 21, a pair of catalyst layer 22, 23 and a pair of gas diffusion layers (GDL: Gas Diffusion Layer) 24, 25.

The catalyst layer 22 comprises a catalyst component, a conductive catalyst carrier that supports the catalyst component and polymer electrolytes; and is an anode catalyst layer in which the oxidative reaction of hydrogen progresses, and is disposed on one side of the electrolyte membrane 21.

The catalyst layer 23 comprises a catalyst component, a conductive catalyst carrier that supports the catalyst component and polymer electrolytes; and is a cathode catalyst layer in which the reductive reaction of oxygen progresses, and is disposed on the other side of the electrolyte membrane 21.

The electrolyte membrane 21 has a function of selectively transmitting protons generated in the catalyst layer 22 to the catalyst layer 23, and a function of acting as a barrier to prevent fuel gas that is supplied to the anode side and the oxidant gas that is supplied to the cathode side from mixing.

The gas diffusion layer 24 is an anode gas diffusion layer for dispersing the fuel gas that is supplied to the anode side, and is positioned between the separator 31 and the catalyst layer 22.

The gas diffusion layer 25 is a cathode gas diffusion layer for dispersing the oxidant gas that is supplied to the cathode side, and is positioned between the separator 32 and the catalyst layer 23.

The separators 31, 32 have a function of electrically connecting the single cells 10 in series, and a function of acting as a barrier to mutually block the fuel gas, the oxidant gas, and the refrigerant from each other. The separators 31, 32 have substantially the same shape as the MEA 20, and are formed by, for example, press working a stainless steel plate. Stainless steel plates are preferable in that complex machining can be easily applied thereto and that the conductivity is good, and it is also possible to apply corrosion resistant coating thereto, if necessary.

The separator 31 is an anode separator that is disposed on the anode side of the MEA 20, and comprises a groove portion 31a that faces the catalyst layer 22 and that configures a gas flow channel that is positioned between the MEA 20 and the separator 31. The groove portion 31a is used to supply fuel gas to the catalyst layer 22.

The separator 32 is a cathode separator that is disposed on the cathode side of the MEA 20, and comprises a groove portion 32a that faces the catalyst layer 23 and that configures a gas flow channel that is positioned between the MEA 20 and the separator 32. The groove portion 32a is used to supply oxidant gas to the catalyst layer 23.

The gaskets 41, 42 are frame-shaped and are disposed on both sides of the outer perimeter part of the electrolyte membrane 21. The gaskets 41, 42 are applied by a screen printing apparatus 100, to be described below.

The gasket 41 is applied to surround the catalyst layer 22 (and the gas diffusion layer 24), and has a function of preventing the fuel gas that is supplied to the catalyst layer 22 from leaking to the outside.

The gasket 42 is applied to surround the catalyst layer 23 (and the gas diffusion layer 25), and has a function of preventing the oxidant gas that is supplied to the catalyst layer 23 from leaking to the outside.

Next, the material and the size of each component member will be described.

For the electrolyte membrane 21, fluorine-based electrolyte membranes composed of perfluorocarbon sulfonic acid polymers, hydrocarbon-based electrolyte membranes having a sulfonic acid group, and porous membranes impregnated with electrolyte components, such as phosphoric acid and ionic liquid. Examples of the perfluorocarbon sulfonic acid polymers include Nafion (registered trademark, DuPont Co., Ltd.), Aciplex (registered trademark, Asahi Kasei Corporation), and Flemion (registered trademark, Asahi Glass Co., Ltd.) can be used. The porous membrane is formed from, for example, polytetrafluoroethylene (PTFE) or polyvinylidenefluoride (PVDF).

The thickness of the electrolyte membrane 21 is not particularly limited, but is preferably 5-300 μm, and more preferably 10-200 μm, from the standpoint of strength, durability, and output characteristics.

The catalyst component that is used for the catalyst layer (cathode catalyst layer) 23 is not particularly limited and can be any component that has a catalytic effect in the reductive reaction of oxygen. The catalyst component that is used for the catalyst layer (anode catalyst layer) 22 is not particularly limited and can be any component that has a catalytic effect in the oxidative reaction of hydrogen.

Specific catalyst components are selected from such metals as platinum, ruthenium, iridium, rhodium, palladium, osmium, tungsten, lead, iron, chromium, cobalt, nickel, manganese, vanadium, molybdenum, gallium, and aluminum, and alloys thereof, etc. It is preferable to include at least platinum in order to improve catalytic activity, resistance to poisoning from carbon monoxide, heat resistance, and the like. The catalyst components that are applied to the cathode catalyst layer and the anode catalyst layer need not be the same, and can be appropriately changed.

The conductive carrier of the catalyst that is used for the catalyst layers 22, 23 is not particularly limited as long as the catalyst carrier has a specific surface area for supporting the catalyst component in the desired dispersed state, and sufficient electronic conductivity as a current collector. The carbon particles can be composed of carbon black, activated carbon, coke, natural graphite, or artificial graphite, for example.

The polymer electrolyte that is used for the catalyst layers 22, 23 is not particularly limited as long the member has at least a high proton conductivity; for example, fluorine-based electrolytes containing fluorine atoms in all or part of the polymer backbone, or hydrocarbon electrolytes that do not contain fluorine atoms in the polymer backbone can be used. The polymer electrolytes used for the catalyst layers 22, 23 can be the same as or different from the polymer electrolytes used for the electrolyte membrane 21, but are preferably the same from the standpoint of improving the adhesion of catalyst layers 22, 23 with respect to the electrolyte membrane 21.

The thickness of the catalyst layer is not particularly limited as long as the thickness is sufficient to exert the catalytic effect of the oxidative reaction of hydrogen (anode side) and the reductive reaction of oxygen (cathode side), and conventional thicknesses can be used. Specifically, the thickness of each catalyst layer is preferably 1-20 μm.

The gas diffusion layers 24, 25 is configured from a sheet material having conductivity and porosity, such as carbon fabric such as glassy carbon, a paper-like paper body, felt, and nonwoven fabric. The thickness of the substrate is not particularly limited, but is preferably 30-500 μm, from the standpoint of mechanical strength and permeability of gas, water, and the like. The gas diffusion layers 24, 25 preferably contain a water-repellent agent in the substrate, from the standpoint of water repellency and suppression of the flooding phenomenon. Examples of water-repellent agents include fluorine-based polymer material such as PTFE, PVDF, poly hexafluoropropylene, and tetrafluoroethylene-hexafluoropropylene copolymers (FEP), polypropylene, and polyethylene.

The separators 31, 31 are not limited to forms configured from stainless steel plates; other metal materials (for example, aluminum plates and clad materials), and carbon, such as dense carbon graphite and carbon plates, may also be applied thereto. When applying carbon, the groove portions 31a, 32a can be formed by cutting or screen printing.

The gaskets 41, 42 are formed from an adhesive. For example, a hot melt adhesive, which is a thermoplastic adhesive, can be used as the adhesive. The thickness of the gaskets 41, 42 is about several millimeters.

Next, the screen printing apparatus 100 for applying a gasket (corresponding to the printing material) 41 onto the separator (object to be printed) 31 of the present embodiment and the metal mask 50 that configures the screen printing apparatus 100 will be described with reference to FIG. 2-FIG. 6.

Figure 2:
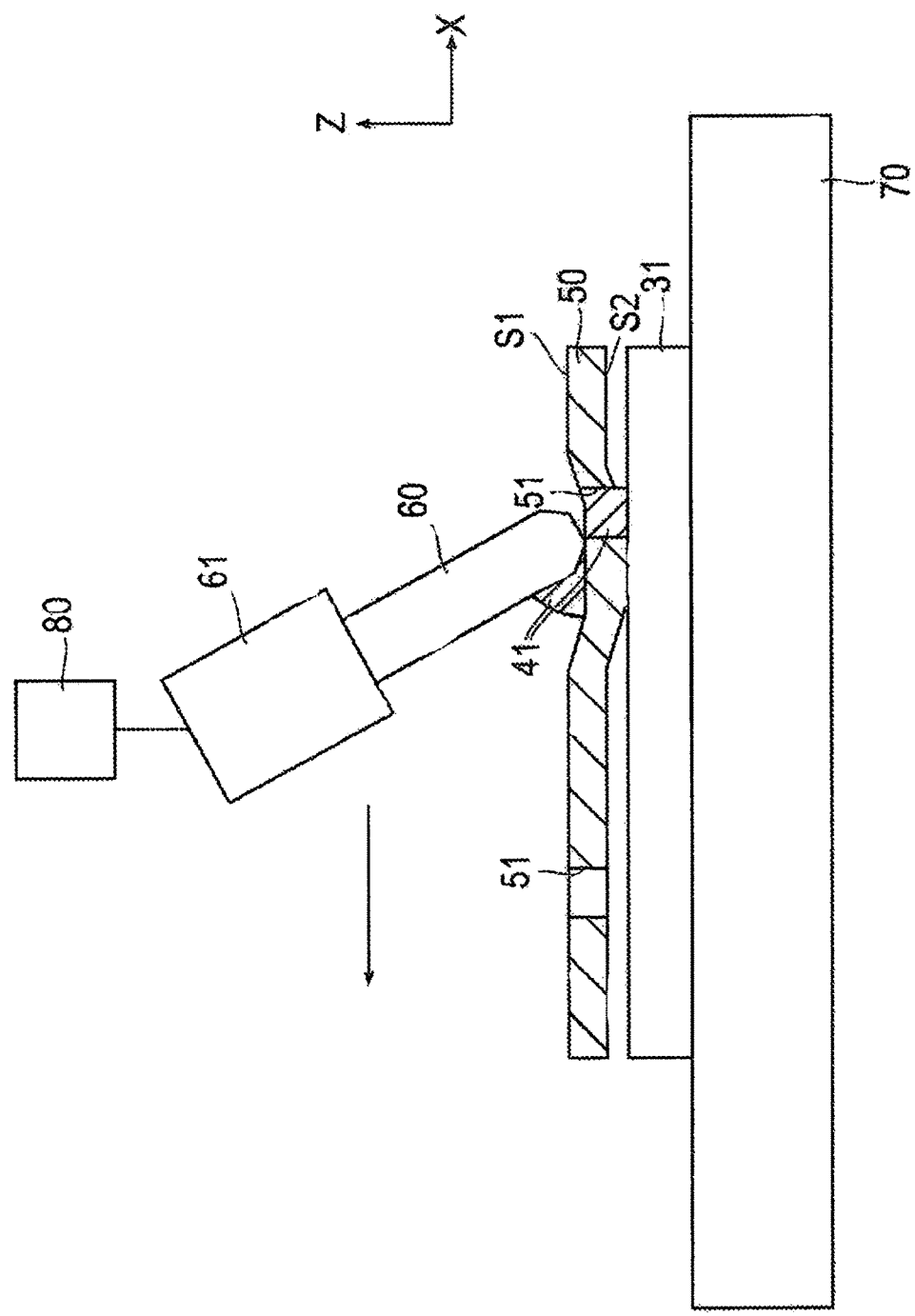
FIG. 2 is a schematic overview illustrating the screen printing apparatus according to the illustrative embodiment.
Figure 3:
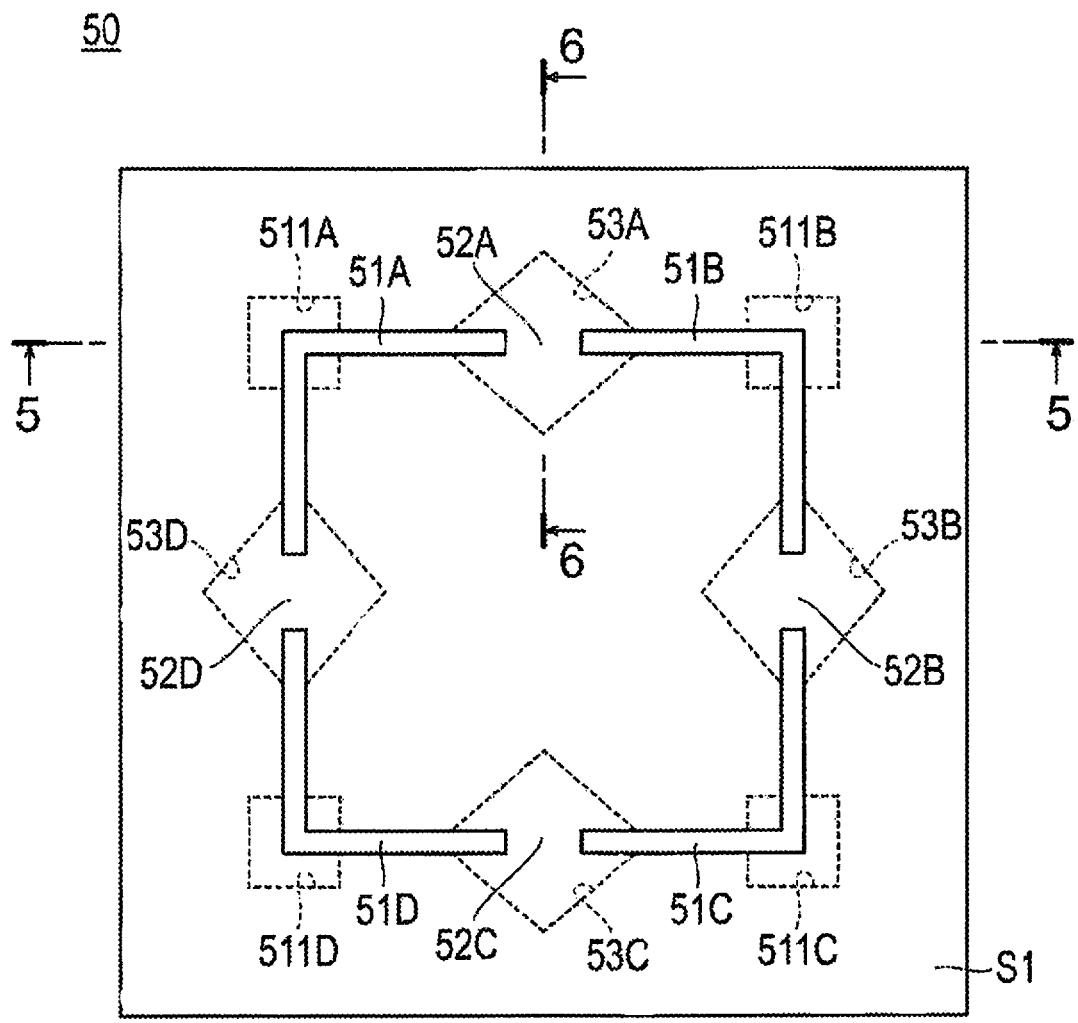
FIG. 3 is an upper surface view of the metal mask according to the illustrative embodiment.
Figure 4:
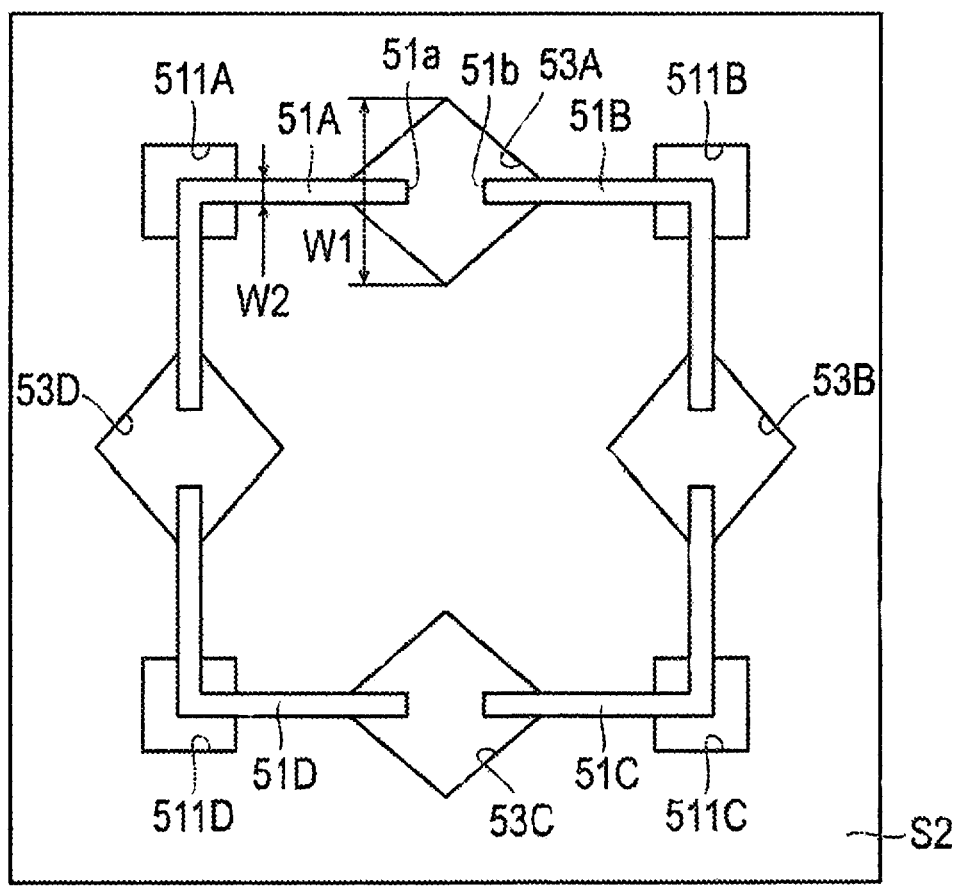
FIG. 4 is a lower surface view of the metal mask according to the illustrative embodiment.
Figure 4:
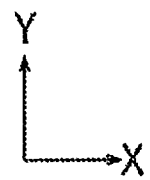
Figure 5:
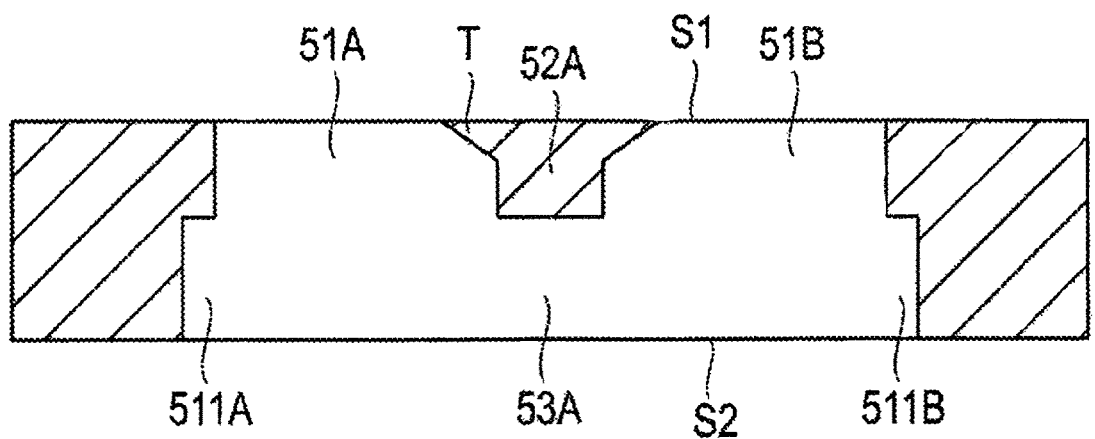
FIG. 5 is a cross-sectional view of the metal mask as seen along section line 5-5 of FIG. 3.
Figure 6:
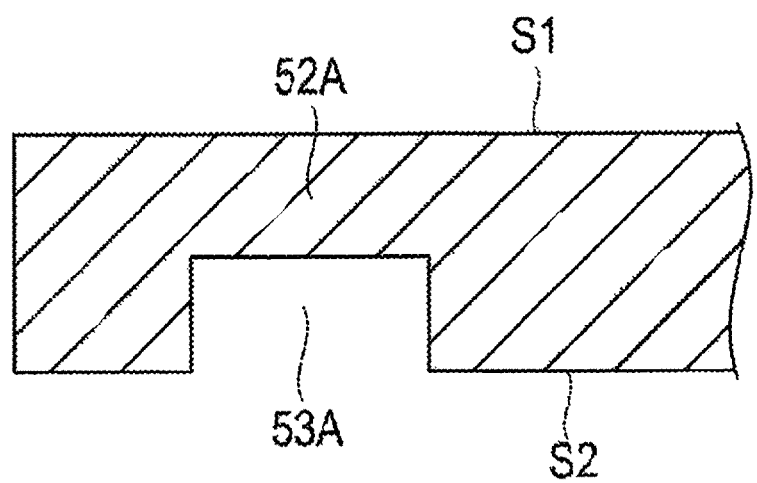
FIG. 6 is a cross-sectional view of the metal mask as seen along line 6-6 of FIG. 3.

FIG. 2 is a schematic overview illustrating the screen printing apparatus 100 according to the present embodiment. FIG. 3 is an upper surface view of the metal mask 50 according to the present embodiment. FIG. 4 is a lower surface view of the metal mask 50 according to the present embodiment. FIG. 5 is a cross-sectional view of the metal mask as seen along line 5-5 of FIG. 3. FIG. 6 is a cross-sectional view of the metal mask as seen along line 6-6 of FIG. 3. In FIG. 2, only the metal mask 50 is illustrated in cross section for the sake of clarity.

The screen printing apparatus 100 comprises a metal mask 50 that is disposed spaced apart on the separator 31 and in which a plurality of openings 51 are formed, and a squeegee 60 that is provided slidably with respect to the metal mask 50, as illustrated in FIG. 2. The screen printing apparatus 100 further comprises a mounting table 70 on which the separator 31 is mounted and a moving unit 80 that moves a support portion 61, which supports the squeegee 60, in the separator 31 plane (XY) direction as well as in the Z direction that is perpendicular to the direction of the plane. The moving unit 80 is, for example, an XYZ stage.

The squeegee 60 is moved while sliding on the surface of the metal mask 50 by the moving unit. As a result, the gasket 41 is pushed out from the opening 51 of the metal mask 50 and applied onto the separator 31. The squeegee 60 is formed from rubber, for example.

The metal mask 50 comprises four openings 51A-51D, as is illustrated in FIG. 3-FIG. 6. The four openings 51A-51D are each formed with an L-shape.

The metal mask 50 comprises bridge portions 52A-52D that are disposed between each of the openings 51A-51D and that are recessed from the lower surface S2. More specifically, the bridge portion 52A is provided between the opening 51A and the opening 51B; the bridge portion 52B is provided between the opening 51B and the opening 51C; the bridge portion 52C is provided between the opening 51C and the opening 51D; and the bridge portion 52D is provided between the opening 51D and the opening 51A. The bridge portions 52A-52D are provided in order to form a closed pattern gasket 41 on the separator 31 after screen printing.

The metal mask 50 comprises filling portions 53A-53D that are provided on the lower surface S2 sides of the bridge portions 52A-52D, and in which are filled the gasket 41 by the sliding of the squeegee 60. Accordingly, by disposing the gasket 41 on the metal mask 50 and by the sliding of the squeegee 60, for example, from the right side to the left side in FIG. 3, the gasket 41 that has passed through the openings 51B, 51C fills the filling portion 53B. Furthermore, by the sliding of the squeegee 60, the gasket 41 fills the filling portions 53A, 53C, and the filling portion 53D, in that order. Thus, it is possible to form a closed pattern of the gasket 41 on the separator 31.

Since the bridge portions 52A-52D have the same shape, only the configuration of the bridge portion 52A is described below, and the configurations of the bridge portions 52B-52D are omitted. In addition, since the filling portions 53A-53D have the same shape, only the configuration of the filling portion 53A is described below, and the configurations of the filling portions 53B-53D are omitted.

The bridge portion 52A has a tapered shape so that the upper surface S1 side thereof becomes wider at the interface T between the openings 51A, 51B on the upper surface S1, as is illustrated in FIG. 5. According to this configuration, when the metal mask 50 is peeled off after the sliding of the squeegee 60, due to the tapered shape, it is possible to suppress the generation of angular edges on the gasket 41 and to reduce coating variability.

Although not shown, the bridge portion 52A is preferably provided with a plurality of fine through-holes that extend in the Z direction. According to this configuration, since the gasket 41 fills the filling portion 53A by means of the through-holes, it is possible to increase the application amount.

The filling portion 53A communicates with the respective ends 51a, 51b of the opening 51A and the opening 51B, and, when viewed from the lower surface S2, the width W1 thereof in the Y direction, which is perpendicular to the X direction extending from the opening 51A to the opening 51B, is larger than the width W2 in the Y direction of the openings 51A, 51B, as is illustrated in FIG. 4.

The filling portion 53A, when viewed from the lower surface S2, has a shape that is wider at substantially the central position between the respective ends 51a, 51b of the opening 51A and the opening 51B, and that becomes narrower toward the respective ends 51a, 51b, as is illustrated in FIG. 4.

The openings 51A-51D have enlarged opening portions 511A-511D that open more widely at the areas that are bent in an L-shape than at the other areas, as is illustrated in FIGS. 3-5. The enlarged opening portions 511A-511D are configured to open widely on the lower surface S2 side, as is illustrated in FIG. 5. The shape of the enlarged opening portions 511A-511D is not limited thereto; the shape is not particularly limited as long as the shape opens more widely in the XY direction than at the other areas, as seen from the lower surface S2.

Next, the actions of the metal mask 50 according to the present embodiment will be described with reference to FIG. 7.

Figure 7:
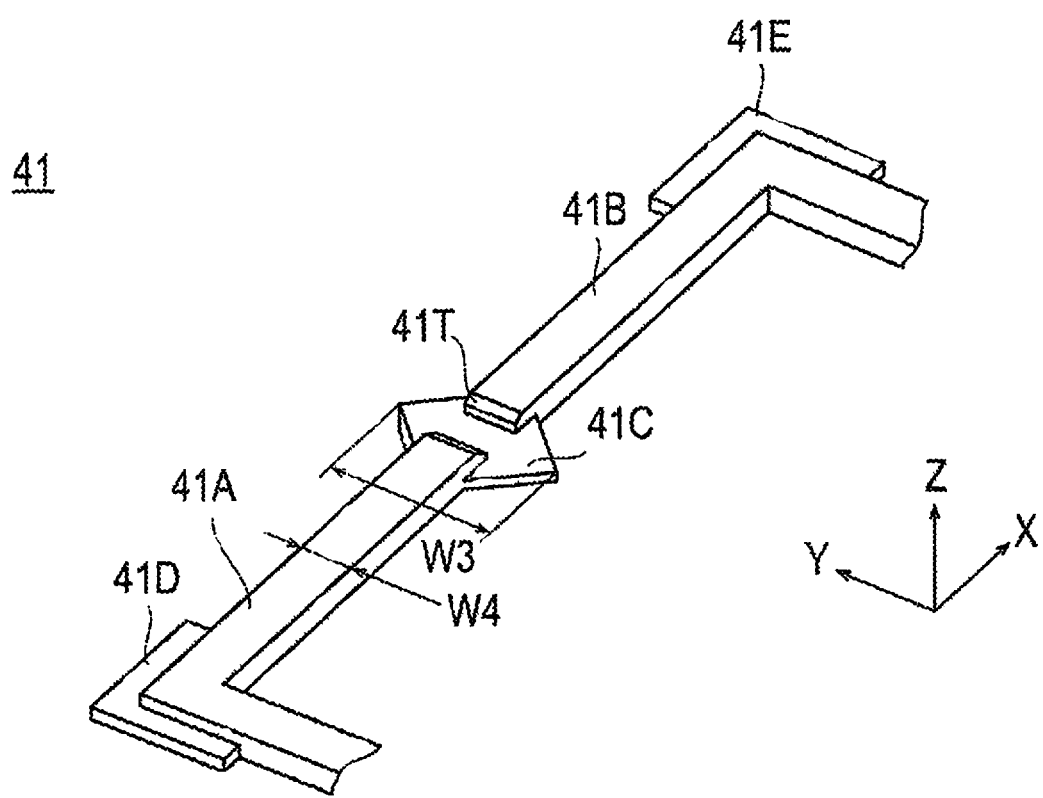
FIG. 7 is a perspective view illustrating the gasket that is applied to the surface of the separator.

FIG. 7 is a perspective view illustrating the gasket 41 that is applied to the separator 31 using the metal mask 50 according to the present embodiment. For ease of understanding, FIG. 7 illustrates the areas that are formed by the filling portion 53A, the bridge portion 52A, and the openings 51A, 51B of the metal mask 50.

By the sliding of the squeegee 60 in a state in which the metal mask 50, on the surface of which is disposed the gasket 41, is disposed on the separator 31, the gasket 41 pattern illustrated in FIG. 7 is formed on the separator 31, as is illustrated in FIG. 2.

The gasket 41 that is formed on the separator 31 comprises a first main body portion 41A that corresponds to the opening 51A, a second main body portion 41B that corresponds to the opening 51B, and a connecting portion 41C that corresponds to the filling portion 53A. The gasket 41 further comprises a first edge portion 41D that corresponds to the enlarged opening portion 511A and a second edge portion 41E that corresponds to the enlarged opening portion 511B. The gasket 41 further comprises a tapered portion 41T that corresponds to the tapered interface T.

The separator 31, on the surface of which is applied the gasket 41, is formed by the screen printing apparatus 100 described above. Additionally, a separator 32, on the surface of which is applied a gasket 42 that has the same configuration as the gasket 41, is prepared in a similar manner. Then, the separator 31 and the separator 32 are layered so that the gasket 41 and the gasket 42 are opposite each other, as illustrated in FIG. 1.

At this time, since the gasket 41 has a tapered portion 41T so that air tends to leak out, air tends not to enter the gasket 41, thereby reducing the risk of leakage.

By laminating the separator 31 and the separator 32, the first main body portion 41A and the second main body portion 41B are compressed in the Z direction to become substantially equal in height with the connecting portion 41C, the first edge portion 41D and the second edge portion 41E.

The width W3 of the connecting portion 41C in the Y direction is configured to be larger than the width W4 of the first main body portion 41A and the second main body portion 41B in the Y direction; therefore, compared to cases in which the widths are the same, as in the prior art, the internal space of the gasket 41 can be more reliably sealed. Therefore, it is possible to suitably prevent the leaking of fuel gas or the oxidant gas to the outside.

In addition, since a first edge portion 41D and a second edge portion 41E are provided to the L-shaped corners of the gasket 41, it is possible to reinforce the corners where stress is concentrated and thereby to improve the strength of the gasket 41.

As described above, the metal mask 50 according to the present embodiment is used for applying the gasket 41 to the separator 31 by the sliding of the squeegee 60. On the metal mask 50 are formed a plurality of openings 51, which extend from the upper surface S1 on the side on which is provided the squeegee 60 to the lower surface S2 on the side on which is provided the separator 31. The metal mask 50 comprises a bridge portion 52A that is disposed between the opening 51A and the opening 51B and that is recessed from the lower surface S2, and a filling portion 53A that is provided in the lower surface S2 side of the bridge portion 52A, and in which is filled the gasket 41 by the sliding of the squeegee 60. The filling portion 53A communicates with the respective ends 51a, 51b of the opening 51A and the opening 51B, and, when viewed from the lower surface S2, the width W2 thereof in the Y direction that intersects the X direction extending from the opening 51A to the opening 51B is larger than the width W1 in the Y direction of the openings 51A, 51B. Thus, a pattern of the gasket 41 that is applied to the surface of the separator 31, in the area where the thickness in the Z direction is thin corresponding to the area where the bridge portion 52A is provided (corresponding to the connecting portion 41C), is formed that is wider than the other areas in the Y direction. Therefore, it is possible to prevent problems caused by a small application amount of the gasket 41 that is applied to the separator 31. Specifically, when such separators 41, 42 are laminated one on top of another, since the gasket is formed wide in the Y direction in the area where the Z direction thickness is thin, it is possible to more reliably seal the internal space of the gasket 41. Therefore, it is possible to suitably prevent the formation of gaps between the laminated gaskets 41, 42 and the leaking of gas to the outside.

In addition, the bridge portion 52A has a tapered shape so that the upper surface S1 side thereof becomes wider at the interface T between the openings 51A, 51B on the upper surface S1. Accordingly, it is possible to suppress the generation of angular edges on the gasket 41 caused by the shearing force generated when the metal mask 50 is peeled off after the sliding of the squeegee 60, allowing a reduction in coating variability. Additionally, air is moved in a direction away from the gasket 41 along the tapered shape when laminating the separators 31, 32; therefore, air does not tend to enter the gasket 41, so that the risk of leakage is reduced.

Furthermore, the opening 51A has an enlarged opening portion 511A that opens more widely than at the other portions. Therefore, a pattern is formed in the first edge portion 41D of the gasket 41, which corresponds to the enlarged opening portion 511A, that has a larger area in the XY direction than at the other portions. Therefore, it is possible to increase the application amount of the gasket 41 at the intended sites. As a result, it is possible to reinforce the desired position, and thereby to improve the strength of the gasket 41.

In particular, the enlarged opening portion 511A is provided in the area where the opening 51A is bent. Accordingly, it is possible to reinforce the corners where stress concentrates, and thereby to improve the strength of the gasket 41.

Additionally, the screen printing apparatus 100 comprises the metal mask 50 described above. Accordingly, it is possible to suitably prevent the generation of gaps between the laminated gaskets 41, 42 and the leakage of gas to the outside.

Furthermore, the screen printing apparatus 100 according to the present embodiment applies the gasket 41 to the surface of the separator 31. According to this screen printing apparatus 100, it is possible provide a fuel cell in which the generation of gaps between the laminated gaskets 41, 42 and the leakage of gas to the outside can be reliably prevented.

Modified examples of the above-described embodiment are illustrated below.

Figure 8:
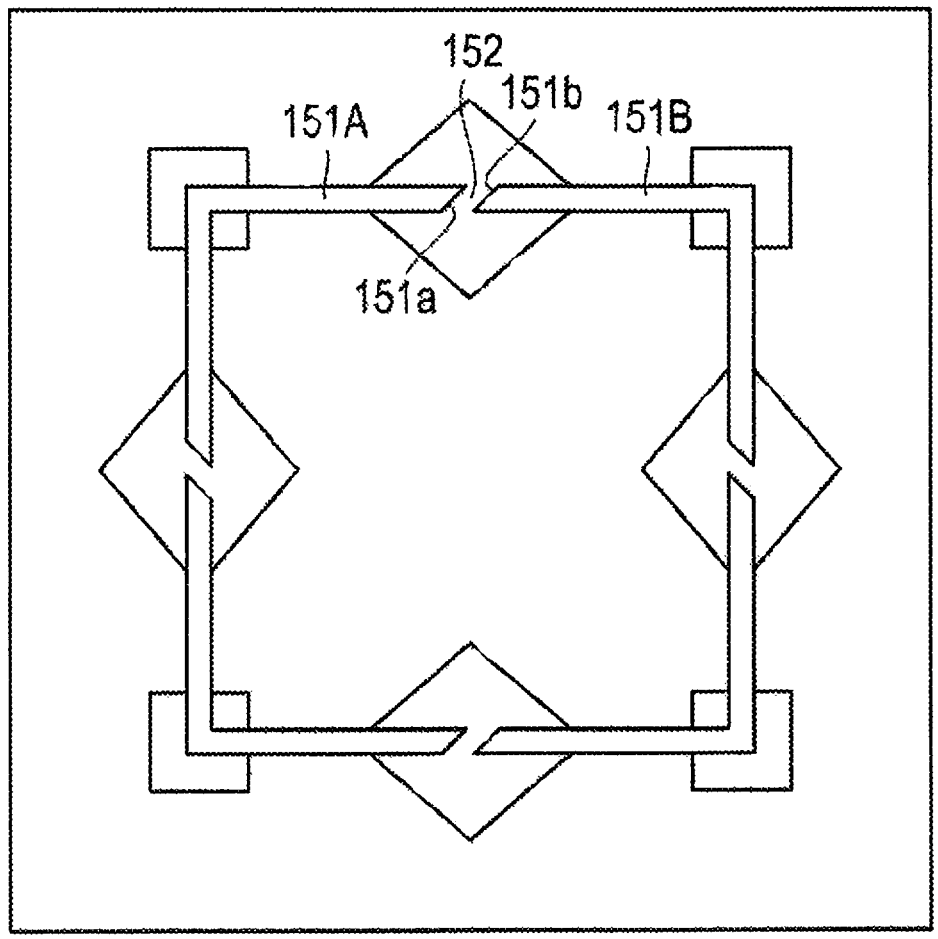
FIG. 8 is a lower surface view of the metal mask according to a modified example.

In the above-described embodiment, the respective ends 51a, 51b of the openings 51A, 51B are extended along the Y direction, as is illustrated in FIG. 4. However, the interface (ends 151a, 151b) of a bridge portion 152 with respect to openings 151A, 151B can be tilted relative to the Y direction as seen from the lower surface S2, and the end 151a and the end 151b can be arranged so as to be wrapped in the Y direction, as is illustrated in FIG. 8. According to this configuration, since the distance between the ends 151a, 151b can be reduced, it is possible to more reliably prevent the generation of gaps between the laminated gaskets 41, 42 and the leakage of gas to the outside.

In addition, in the above-described embodiment, each of the bridge portions 52A-52D has the same shape, and each of the filling portions 53A-53D has the same shape. However, no limitation is thereby implied; the shapes can be different from each other within a range that allows the effects of the present invention to be imparted.

Furthermore, in the above-described embodiment, the bridge portion 52A has a tapered shape so that the upper surface S1 side thereof becomes wider at the interface T between the openings 51A, 51B on the upper surface S1. However, the interface T can be R-shaped so that the upper surface S1 side becomes wider.

In addition, in the above-described embodiment, the enlarged opening portions 511A-511D are provided at the corners of the openings 51A-51D. However, no limitation is thereby implied; the enlarged opening portions can be provided anywhere.

Additionally, in the above-described embodiment, the filling portion 53A has a shape that is wider at substantially the central position between the respective ends 51a, 51b of the opening 51A and the opening 51B and that becomes narrower toward the respective ends 51a, 51b. However, no limitation is thereby implied; the width of the filling portion in the Y direction need only be larger than the width of the openings in the Y direction.

Furthermore, in the above-described embodiment, an embodiment was described in which screen printing is carried out by placing the gasket 41 on the upper surface of the metal mask 50 and pressing and sliding the squeegee 60 over the separator 31. However, screen printing can be carried out by the sliding of the squeegee 60 after flattening the gasket 41 on the upper surface of the metal mask 50 using a scraper before the sliding of the squeegee 60.

Additionally, in the above-described embodiment, the metal mask was used in a method to apply the gasket 41 on the separator 31 as the screen printing method; however, no limitation is thereby implied; the metal mask can be used with any screen printing apparatus.

The invention claimed is:

1. A metal mask for screen printing a printing material on an object to be printed by sliding of a squeegee thereon, and which are formed a plurality of openings that pass from a first surface on a side on which the squeegee is provided to a second surface on a side on which the object to be printed is provided, comprising:
   a bridge portion disposed between one of the openings and the other of the openings, and that is recessed from the second surface, and
   a filling portion provided on a second surface side of the bridge portion, and in which is filled the printing material by the sliding of the squeegee, wherein
   the filling portion communicates with respective ends of the one opening and the other opening and, as seen from the second surface, has a width in a second direction that intersects a first direction extending from the one opening to the other opening is greater than a width of the openings in the second direction.

2. The metal mask according to claim 1, wherein
   the bridge portion has a tapered shape or an R-shape so that a first surface side of the bridge portion becomes wider at an interface between the openings at the first surface.

3. The metal mask according to claim 1, wherein
   the openings have enlarged opening portions that open more widely than at other portions of the openings.

4. The metal mask according to claim 3, wherein
   the enlarged opening portions are provided in areas of the openings where the openings are bent.

5. The metal mask according to claim 1, wherein
   an interface of the bridge portion with respect to the openings is tilted relative to the second direction in a plan view of a first plane, and the interface at one of the openings and the interface at the other of the openings are arranged so as to be wrapped in the second direction.

6. A screen printing apparatus comprising the metal mask according to claim 1.

7. The screen printing apparatus according to claim 6, wherein
   the object to be printed is a separator of a fuel cell, and the printing material is an adhesive that forms a gasket that is applied to the separator.

8. The metal mask according to claim 2, wherein
   the openings have enlarged opening portions that open more widely than at other portions of the openings.

9. The metal mask according to claim 8, wherein
   the enlarged opening portions are provided in areas of the openings where the openings are bent.

10. The metal mask according to claim 2, wherein
    an interface of the bridge portion with respect to the openings is tilted relative to the second direction in a plan view of the first plane, and the interface at one of the openings and the interface at the other of the openings are arranged so as to be wrapped in the second direction.

11. The metal mask according to claim 3, wherein
    an interface of the bridge portion with respect to the openings is tilted relative to the second direction in a plan view of a first plane, and the interface at one of the openings and the interface at the other of the openings are arranged so as to be wrapped in the second direction.

12. The metal mask according to claim 4, wherein
    an interface of the bridge portion with respect to the openings is tilted relative to the second direction in a plan view of a first plane, and the interface at one of the openings and the interface at the other of the openings are arranged so as to be wrapped in the second direction.

\* \* \* \* \*